United States Patent
Lan et al.

(10) Patent No.: US 9,163,326 B2
(45) Date of Patent: Oct. 20, 2015

(54) CRYSTAL GROWTH DEVICE

(75) Inventors: Chung-Wen Lan, Hsinchu (TW); Bruce Hsu, Hsinchu (TW); Wen-Huai Yu, Hsinchu (TW); Wen-Chieh Lan, Hsinchu (TW); Yu-Min Yang, Hsinchu (TW); Kai-Yuan Pai, Hsinchu (TW); Wen-Ching Hsu, Hsinchu (TW)

(73) Assignee: Sino-American Silicon Products Inc., Hsinchu (TW)

( * ) Notice: Subject to any disclaimer, the term of this patent is extended or adjusted under 35 U.S.C. 154(b) by 94 days.

(21) Appl. No.: 13/479,497

(22) Filed: May 24, 2012

(65) Prior Publication Data
US 2013/0133569 A1    May 30, 2013

(30) Foreign Application Priority Data
Jul. 12, 2011 (TW) .............................. 100124589 A

(51) Int. Cl.
*C30B 11/00*     (2006.01)
*C30B 21/02*     (2006.01)

(52) U.S. Cl.
CPC .............. *C30B 11/003* (2013.01); *C30B 11/007* (2013.01); *C30B 21/02* (2013.01); *Y10T 117/1092* (2015.01)

(58) Field of Classification Search
CPC .. C30B 21/02; C30B 11/003; Y10T 117/1092
USPC ........................................................ 117/223
See application file for complete search history.

(56) References Cited

U.S. PATENT DOCUMENTS

| 7,364,715 | B2 * | 4/2008 | Nawata et al. ................ 423/490 |
| 2006/0188416 | A1 * | 8/2006 | Alward et al. ................ 422/180 |
| 2007/0022945 | A1 * | 2/2007 | Mueller ........................... 117/84 |
| 2008/0035051 | A1 * | 2/2008 | Schmid et al. .................. 117/74 |
| 2010/0037816 | A1 * | 2/2010 | Wan ................................ 117/74 |

FOREIGN PATENT DOCUMENTS

WO    WO 2009014961 A1 *   1/2009       C30B 11/00

* cited by examiner

*Primary Examiner* — Michael Kornakov
*Assistant Examiner* — Hua Qi
(74) *Attorney, Agent, or Firm* — Osha Liang LLP

(57) ABSTRACT

A crystal growth device includes a crucible and a heater setting. The crucible has a bottom and a top opening. The heater setting surrounds the crucible and is movable relative to the crucible along a top-bottom direction of the crucible and between first and second positions. The heater setting includes a first temperature heating zone and a second temperature heating zone higher in temperature than the first temperature heating zone. The heater setting is in the first position when the crucible is in the second temperature heating zone and in the second position when the crucible is in the first temperature heating zone.

13 Claims, 12 Drawing Sheets

CRYSTAL GROWTH DEVICE

CROSS-REFERENCE TO RELATED APPLICATION

This application claims priority of Taiwanese Patent Application No. 100124589 filed on Jul. 12, 2011.

BACKGROUND OF THE INVENTION

1. Field of the Invention

The present invention relates to a heating device and, more particularly, to a crystal growth device for growing crystals.

2. Description of the Related Art

The quality of a crystal rod depends upon several factors, such as a crystal growing process, purity of a crystal raw material, etc. In particular, in the design of a crystal growth device, a heating zone provided for the molten crystal raw material has a direct influence on the crystal growth interface, the nucleation at an initial stage of the crystal growth, the grain size during the crystal growth process, and the like that are in connection with the quality of the final product of the crystal rod. Therefore, the research and development of the crystal growth device is always a subject concerned by the industry.

Referring to FIG. 1, a conventional crystal growth device 1 comprises a crucible 11 for receiving a crystal raw material, a heating member 12 surrounding the crucible 11 and movable relative to the crucible 11 along a top-bottom direction of the crucible 11 for heating the crucible 11, a heat conducting member 13 surrounding the crucible 11, and a pedestal 14 on which the heat conducting member 13 and the crucible 11 are placed.

During the crystal growth, the heating member 12 starts heating to provide a crystal raw material 100 contained in the crucible 11 with a fixed temperature heating zone. After the crystal raw material 100 is molten, the heating member 12 is moved upwardly relative to the immobilized crucible 11 such that the molten crystal raw material 100 begins to proceed nucleation and crystal growth along with the varying temperature (i.e. the lowering of the temperature) of the heating zone resulting from the movement of the crucible 11 relative to the heating member 12 and from the conduction of heat by the heat conducting member and the pedestal 14. Finally, a crystal rod is obtained.

When the conventional crystal growth device 1 is used to produce, for example, a polysilicon crystal rod, according to the research, if, during the crystal growth process, the crystal growth interface 101 of the molten silicon crystal raw material is controlled to have a flat, or even slightly convex crystal surface, the heat stress may be reduced. In addition, controlling of the efficiency and mass of the nucleation at the initial stage of the crystal growth may enhance the formation of the twin boundary to facilitate the elimination of the lattice defects such as, dislocation and to obtain polysilicon crystal rod with an improved quality. However, in the conventional crystal growth device 1, since a single temperature heating zone is formed by means of the heating member 12, control of the temperature gradient of the heating zone is insufficient, and the key factors of crystal growth, such as nucleation, the form of the solid-liquid grain interface 101 and the like are difficult to handle effectively when the silicon crystal raw material is grown in the crucible 11.

In addition, when the crystal rod is prepared by such as the Bridgeman method, the crucible is lowered away from a heating unit that generally includes a top heater and an annular side heater that are mounted separately. A cooling water circulation device is additionally disposed in a base plate in order to enhance the control of the crystal growth speed. Although the initial crystallization speed in the bottom of the crucible may be increased, similar to the conventional crystal growth device 1, it is difficult to control the heating zone of the solid phase region and the solid-liquid interface. In addition, the molten crystal raw material in the crucible may begin to solidify at the surface thereof as the heaters are moved gradually away from the molten crystal raw material. Furthermore, the movement of the crucible is liable to cause the crucible to damage due to vibration, and interfere with the crystal growth.

In addition, to further improve the crystal growth quality, for example, Taiwanese Utility Model No. M386302 and Taiwanese Patent Publication No. 201111566m disclose a technique that provides a special heat conduction design for a base plate.

However, a polysilicon crystal rod with a better quality is still required for the rapidly increasing development of the semiconductor industry and photoelectric industry. Therefore, it would be desirable to provide a crystal growth device that has a more precise temperature gradient control for a heating zone.

SUMMARY OF THE INVENTION

Therefore, an object of the present invention is to provide a crystal growth device with improvements over the prior art in terms of the crystal growth interface and the control of the temperature gradient of the heating zone.

Accordingly, a crystal growth device of the present invention comprises a crucible and a heater setting. The crucible has a bottom and a top opening. The heater setting surrounds the crucible and is movable relative to the crucible along a top-bottom direction of the crucible and between first and second positions. The heater setting includes a first temperature heating zone and a second temperature heating zone higher in temperature than the first temperature heating zone. The heater setting is in the first position when the crucible is in the second temperature heating zone and in the second position when the crucible is in the first temperature heating zone.

Preferably, the heater setting includes a heating member surrounding the crucible to heat the crucible, and a heat insulation member surrounding the crucible and covering an inner surface of a lower part of the heating member. The first temperature heating zone is confined by the heating insulation member and the lower part of the heating member. The second temperature heating zone is confined by an upper part of the heating member immediately above the first temperature heating zone.

Preferably, the heat insulation member is made of a material having a heat conductivity of 0.5-0.01 W/mK.

Preferably, when the heater setting is in the first position, a top end of the heat insulation member is not higher than the bottom of the crucible.

Preferably, the heater setting further includes a heat conducting unit, which has a heat conductive base plate below the bottom of the crucible, and a heat conductive surrounding wall extending upward from the heat conductive base plate around the crucible. The heat conductive base plate and surrounding wall have different heat conductivities.

Preferably, the heat conductive base plate and surrounding wall are in contact with an outer surface of the crucible.

Preferably, the heat insulation member has a top end substantially flush with an interface between the heat conductive base plate and the bottom of the crucible when the crucible is in the heater setting is in the first position.

Preferably, the heat insulation member has a height not smaller than that of the crucible when the crucible is in the first temperature heating zone.

Preferably, the heat insulation member has a height smaller than that of the crucible when the crucible is in the first temperature heating zone.

Preferably, the heat conductive base plate is made of a material having a conductivity of not smaller than 100 W/mK.

Preferably, the heat conductive base plate is made of a material having a heat conductivity of 100-250 W/mK.

Preferably, the heat conductive base plate includes a first heat exchange region immediately below a middle part of the bottom of the crucible, and a second heat exchange region surrounding the first heat exchange region and having a heat conductivity lower than that of the first heat exchange region.

Preferably, the heat conductive surrounding wall has a heat conductivity lower than that of the first heat exchange region.

Preferably, the crystal growth device further comprises a heat conducting pedestal supporting the crucible and the heat conducting unit.

Preferably, the heat conducting pedestal is disposed in contact with the heat conductive base plate to increase heat transfer between the heat conductive base plate and the crucible.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
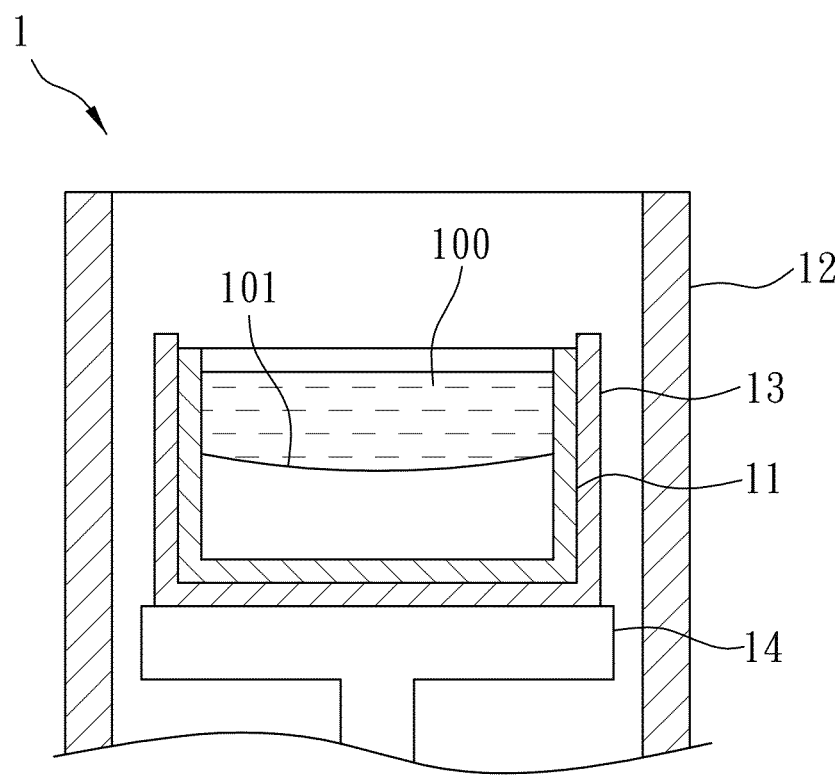
FIG. 1 is a sectional schematic view of a conventional crystal growth device.

Before the present invention is described in greater detail, it should be noted that like components are assigned the same reference numerals throughout the following disclosure.

Figure 2:
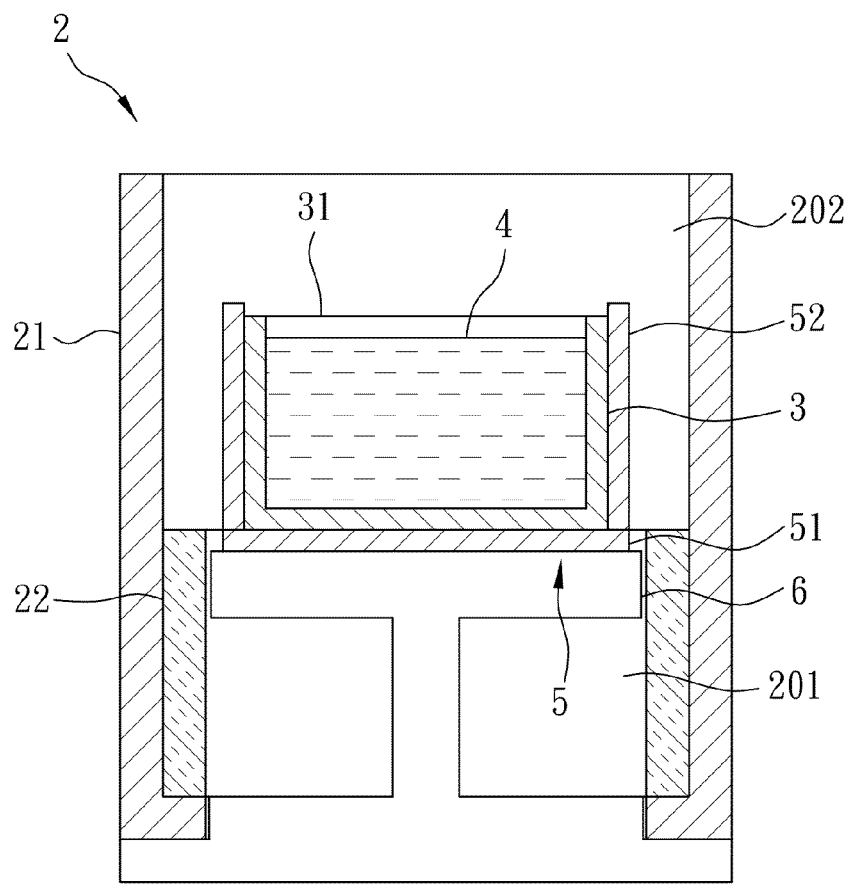
FIG. 2 is a sectional schematic view of a first preferred embodiment of a crystal growth device according to the present invention.

Referring to FIG. 2, a first preferred embodiment of a crystal growth device of the present invention comprises a crucible 3 and a heater setting 2. The crucible 3 has a bottom and a top opening 31 through which a crystal raw material 4 may be received in the crucible 3.

Figure 3:
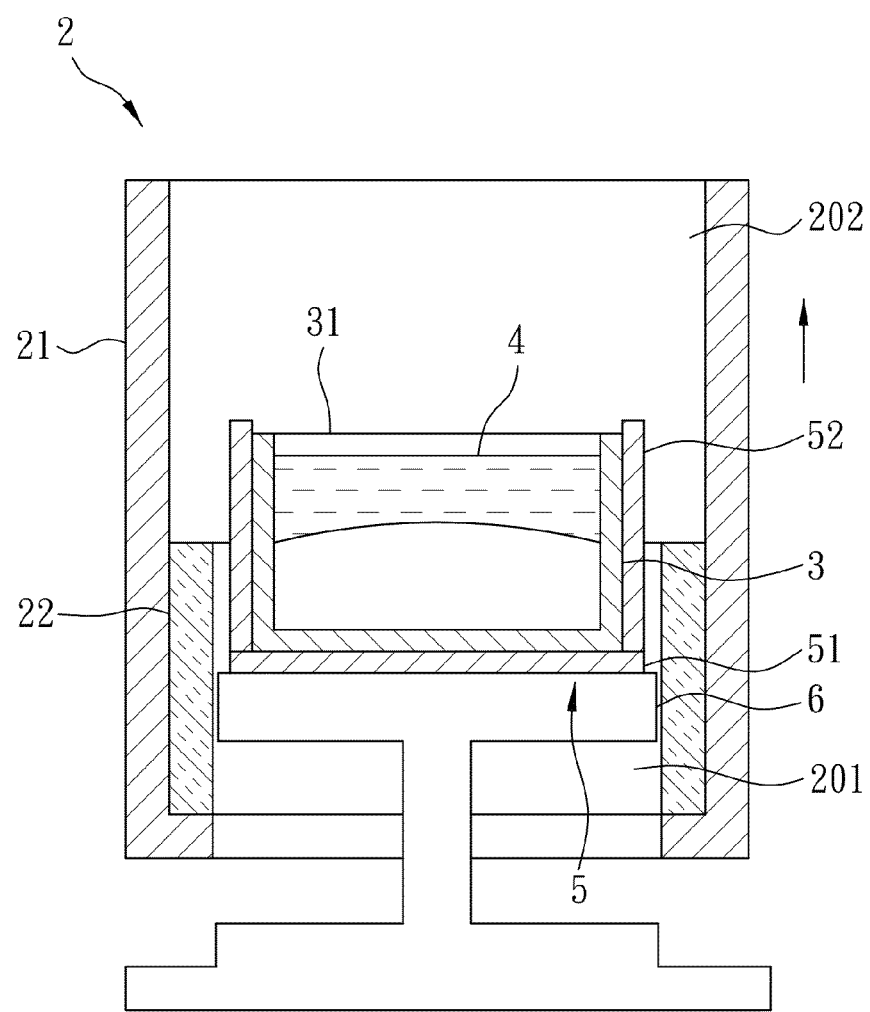
FIG. 3 is a sectional schematic view illustrating a heater setting moving from a first position to a second position.
Figure 4:
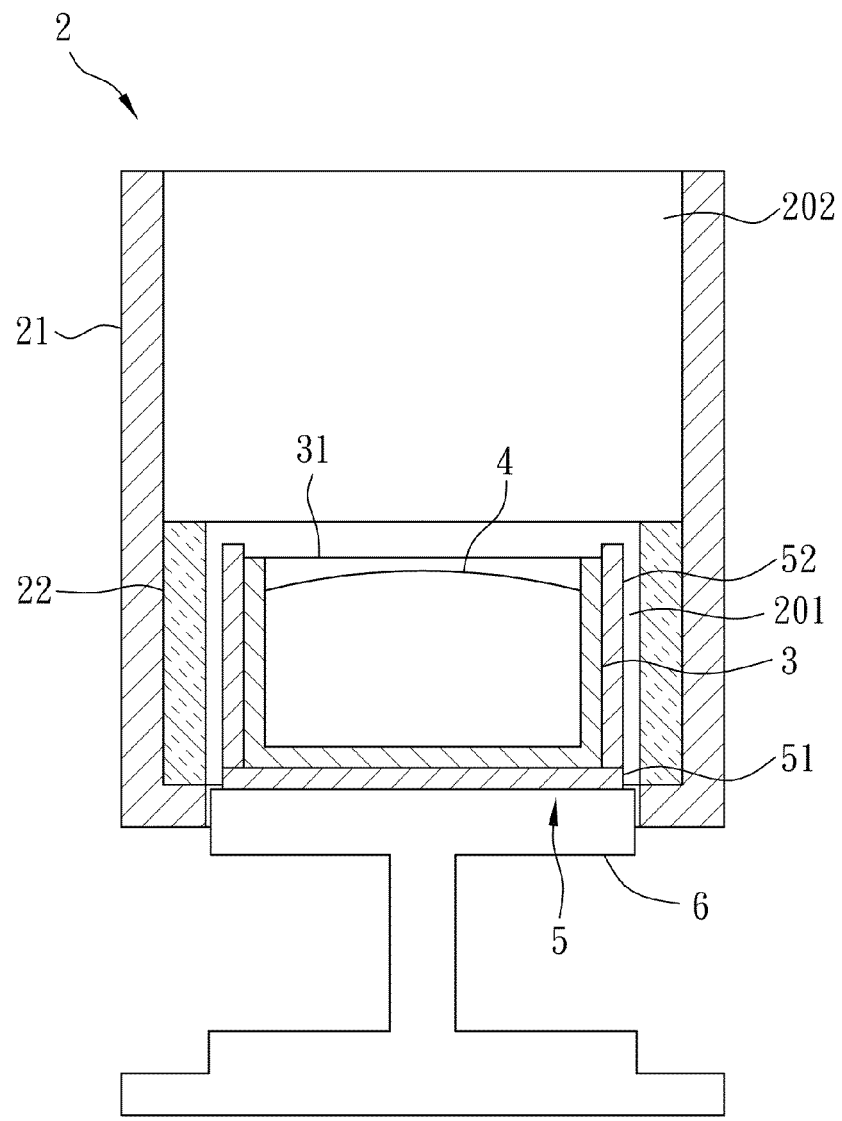
FIG. 4 is a sectional schematic view illustrating the relative position of the crucible when the heater setting is in the second position.

Referring also to FIGS. 3 and 4, the heater setting 2 surrounds the crucible 3 and is movable relative to the crucible 3 along a top-bottom direction of the crucible 3 and between first and second positions, as shown respectively in FIGS. 2 and 4. The heater setting 2 includes a first temperature heating zone 201 and a second temperature heating zone 202 higher in temperature than the first temperature heating zone 201. The heater setting 2 is in the first position when the crucible 3 is in the second temperature heating zone 202 and in the second position when the crucible 3 is in the first temperature heating zone 201.

The heater setting 2 includes a heating member 21 surrounding the crucible 3 to heat the crucible 3 so as to form a stable temperature heating zone, and a heat insulation member 22 surrounding the crucible 3 and covering an inner surface of a lower part of the heating member 21. The first temperature heating zone 201 is confined by the heating insulation member 22 and the lower part of the heating member 21. The second temperature heating zone 202 is confined by an upper part of the heating member 21 immediately above the first temperature heating zone 201. Preferably, the heat insulation member 22 is made of a material having a heat conductivity of 0.5-0.01 W/mK. When the heater setting 2 is in the first position, a top end of the heat insulation member 22 is not higher than the bottom of the crucible 3 (see FIG. 2). The heat insulation member 22 has a height not lower than that of the crucible 3 when the crucible 3 is in the first temperature heating zone 201, as shown in FIG. 4. Particularly, the top end of the heat insulation member 22 is higher than the top end of the crucible 3, and the bottom end of the heat insulation member 22 is lower than the bottom of the crucible 3.

The heater setting 2 further includes a heat conducting unit 5. The heat conducting unit 5 has a heat conductive base plate 51 below the bottom of the crucible 3, and a heat conductive surrounding wall 52 extending upward from the heat conductive base plate 51 around the crucible 3. The base plate 51 is used for conducting heat from the crucible 3, and the surrounding wall 52 is used for maintaining heat. The heat conductive base plate 51 and surrounding wall 52 have different heat conductivities. Preferably, the heat conductive base plate 51 and surrounding wall 52 are in contact with an outer surface of the crucible 3 to achieve a direct heat exchange. The heat conductive base plate 51 is made of a material having a conductivity of not smaller than 100 W/mK. Preferably, the heat conductive base plate 51 is made of a material having a heat conductivity of 100-250 W/mK in order to achieve a better heat exchange efficiency.

The heater setting 2 further includes a heat conductive pedestal 6 supporting the crucible 3 and the heat conducting unit 5. The heat conductive pedestal 6 is disposed in contact with the heat conductive base plate 51 of the heat conducting unit 5 to increase heat transfer between the heat conductive base plate 51 and the crucible 3, so that the heat exchange of the overall device is more stable.

Taking the crystal growth of a polysilicon as an example, when the heater setting 2 is in the first position, the crucible 3 is totally in the second temperature heating zone 202. At this time, the silicon crystal raw material received in the crucible 3 is molten and has not started to nucleate and grow yet. When the heater setting 2 is moved from the first position to the second position relative to the crucible 3, the molten silicon crystal raw material received in the crucible 3 begins to produce a solid-liquid interface at the junction of the first temperature heating zone 201 and the second temperature heating zone 202 due to the instantaneous change of the temperature at the junction of the first and second temperature heating zones 201, 202. The crystal is then grown in the moving direction of the junction of the first temperature heating zone 201 and the second temperature heating zone 202. In this way, the crystal starts to grow upwardly from the bottom of the crucible 3 along the moving direction of the heating zone. Therefore, by well controlling the temperature gradient of the heating zone as such, the silicon crystal raw material can be grown and formed with more twin crystal boundaries during the nucleation process. With the position variation of the heater setting 2 relative to the crucible 3, the abovementioned crystal growth process is repeated, and finally, the silicon crystal raw material is grown into a complete polysilicon crystal with an improved quality.

Figure 5:
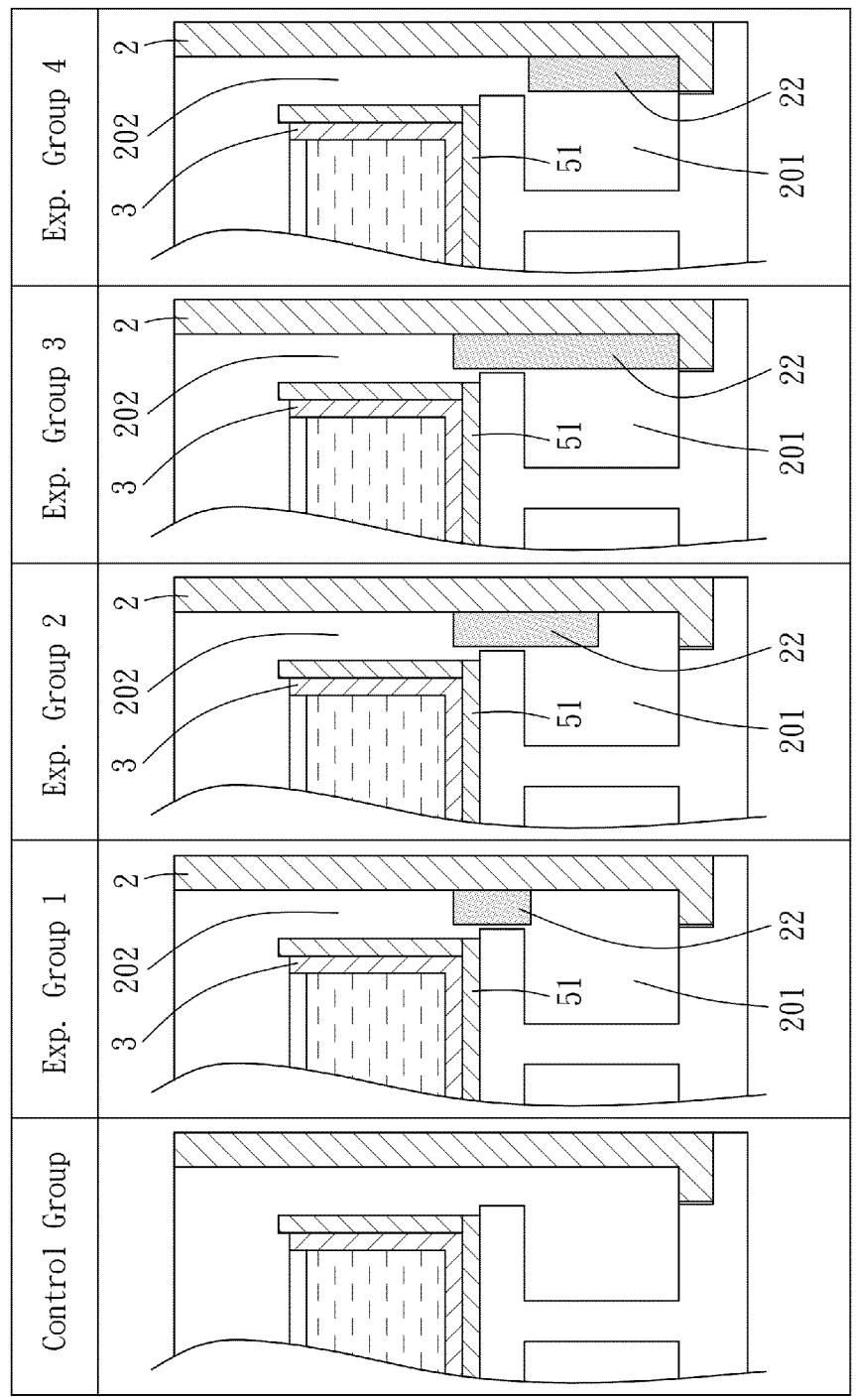
FIG. 5 includes sectional views illustrating the structures of the control group and experimental groups used in experiments.

Experiments were conducted to obtain experimental and simulation data in terms of the position and covering range of the heat insulation member 22. The structures used in the experiments are shown in FIG. 5, and include one control group and four experimental groups. The control group has the structure of the conventional crystal growth device 1 that has no heat insulation member and has a single temperature heating zone. The experimental groups 1 to 3 have the heat insulation members 22 and the first and second temperature heating zones 201, 202 of the present invention. The height of the heat insulation member is varied by increments of height in the experimental groups 1 to 3. Each heat insulation member 22 in the experimental groups 1 to 3 has a top end substantially flush with an interface between the heat conductive base plate 51 and the bottom of the crucible 3 when the heater setting 2 in the first position. An axial length of the heat insulation member 22 of the experimental group 3 is equal to that of the heat insulation member 22 of the first preferred embodiment. An axial length of the heat insulation member 22 of the experimental group 4 is similar to that of the heat insulation member 22 of the experimental group 2. But, when the heater setting 2 is in the first position, the top of the heat insulation member 22 of the experimental group 4 is lower than the bottom of the crucible 3. The experimental results are shown in the following table.

Figure 8:
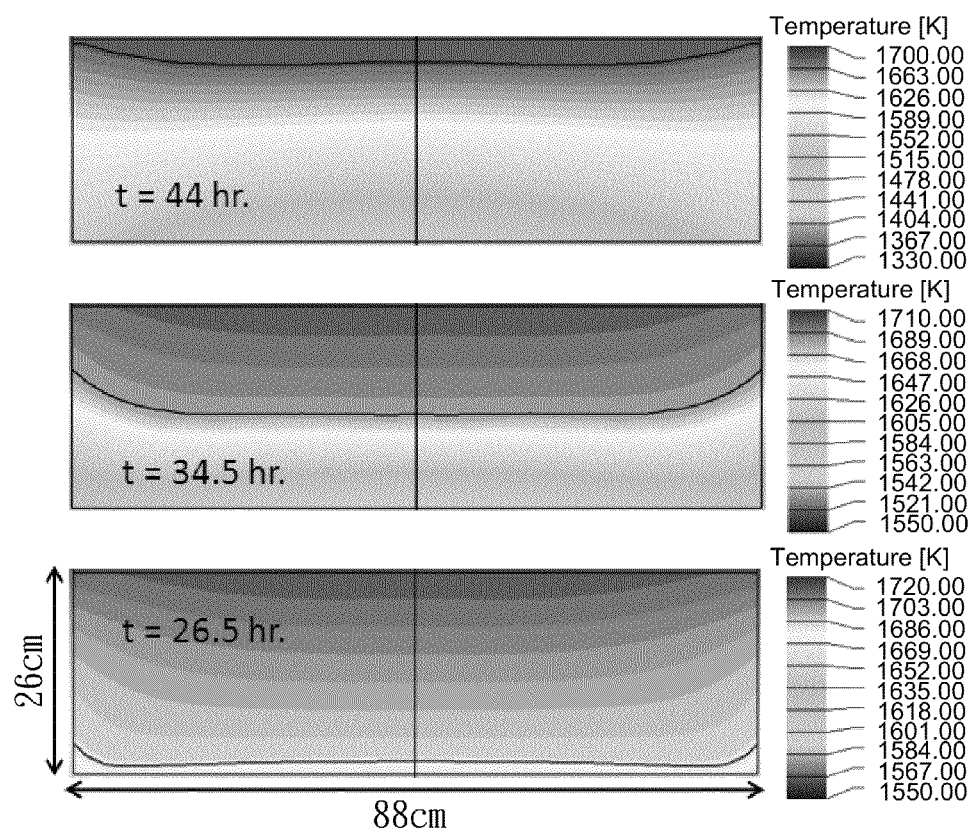
FIGS. 8 to 12 are diagrams illustrating simulation temperature profiles of the control group and the experimental groups.
Figure 9:
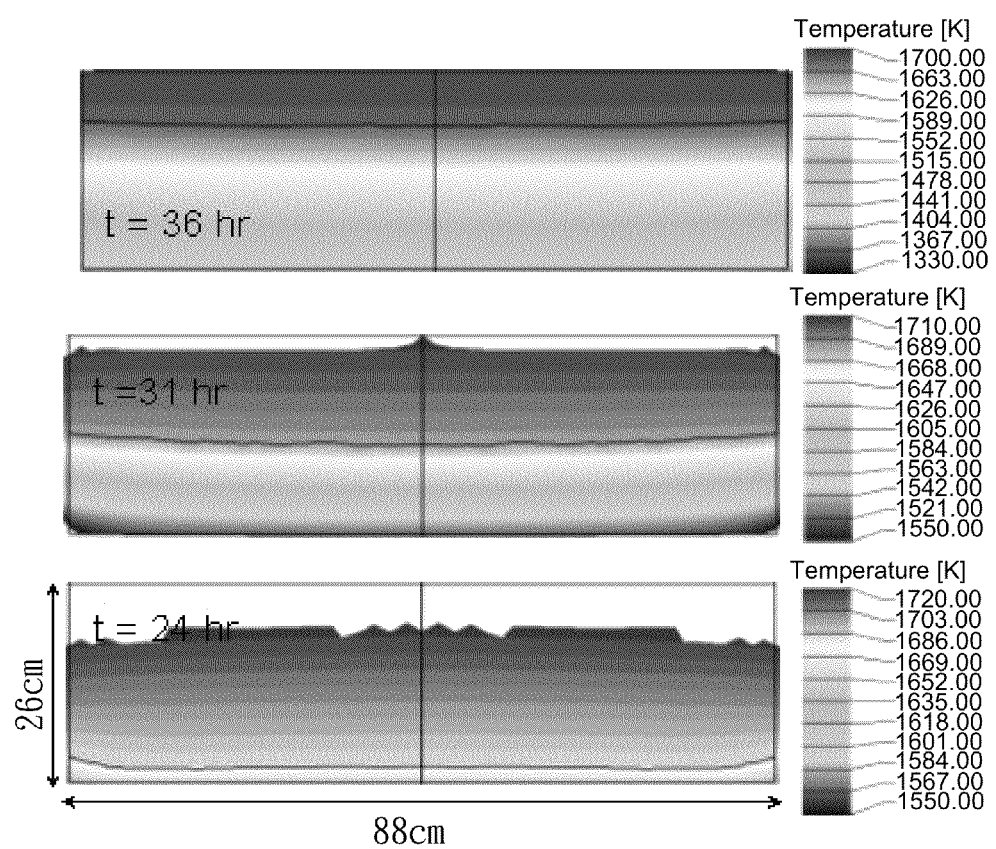
Figure 10:
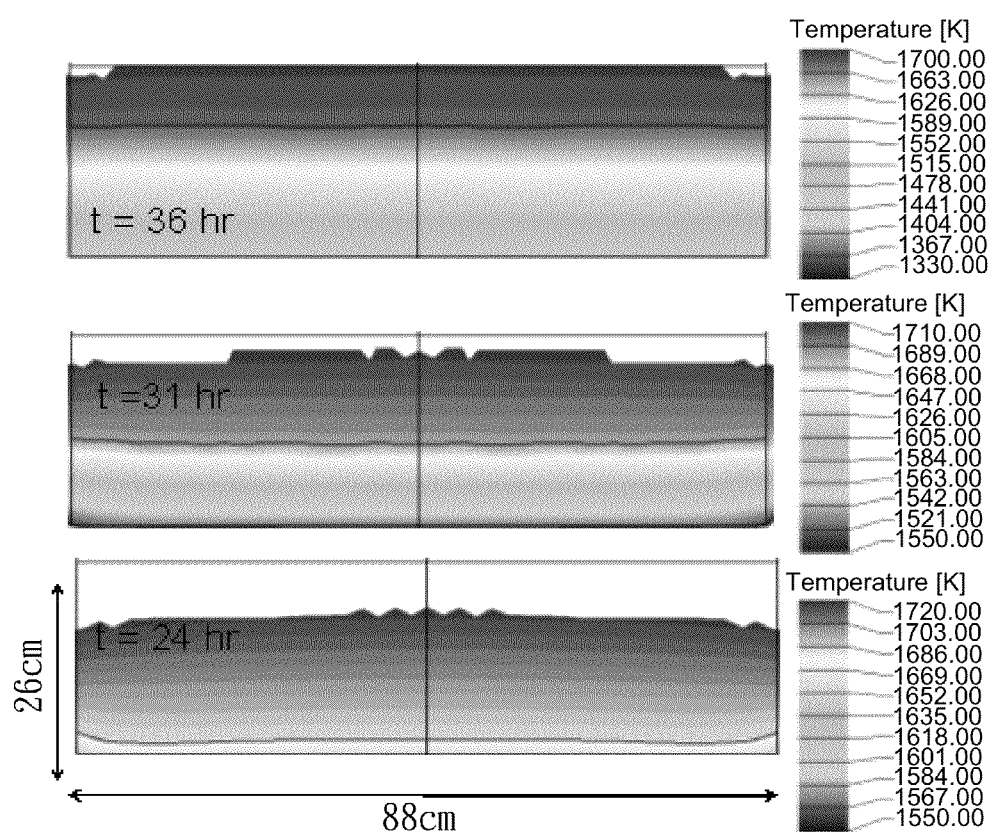
Figure 11:
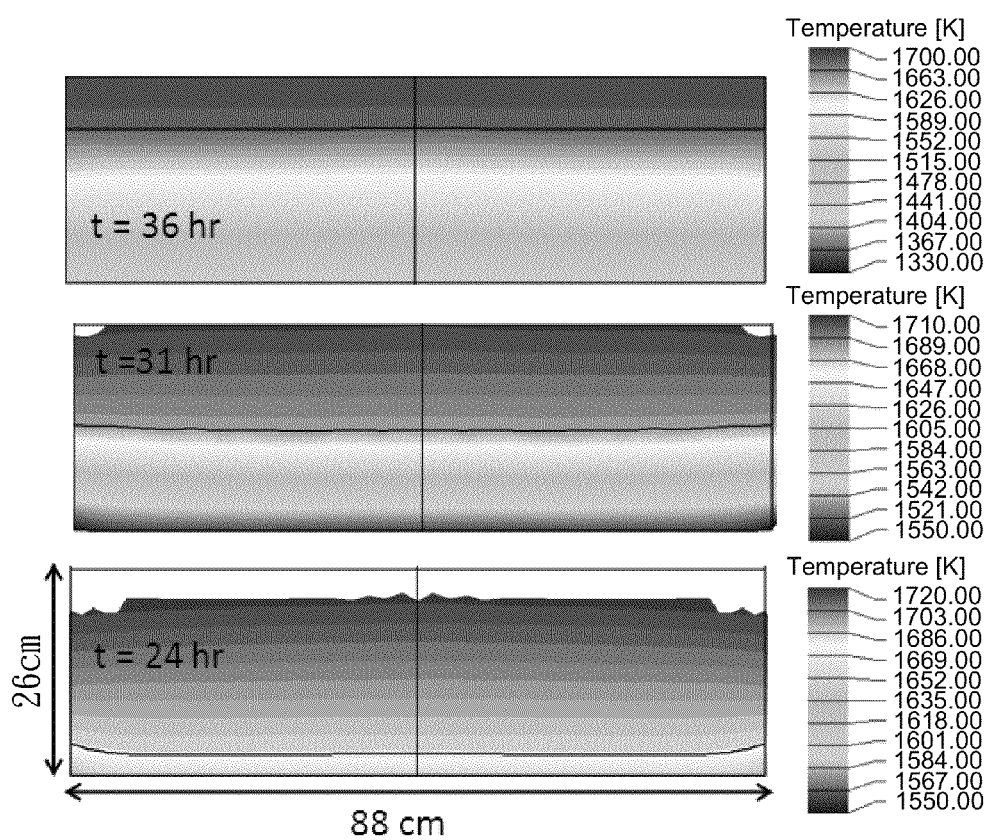
Figure 12:
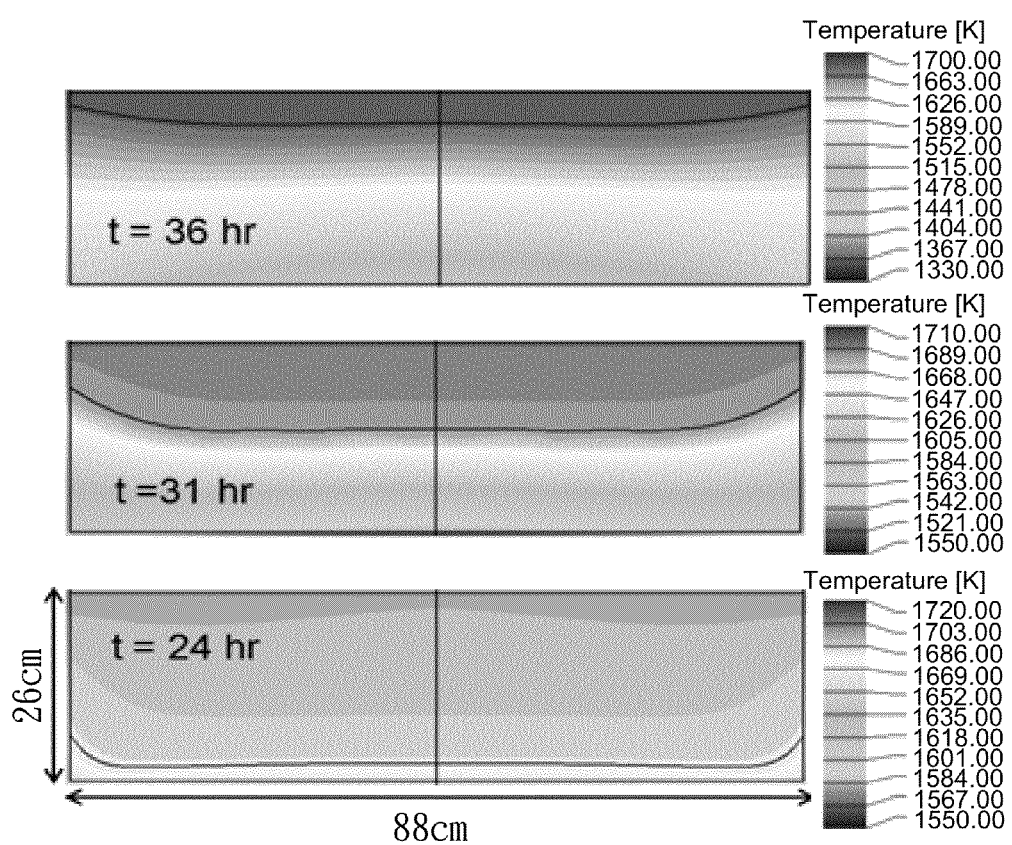

|  | FIG. 8 Control group | FIG. 9 Experimental group 1 | FIG. 10 Experimental group 2 | FIG. 11 Experimental group 3 | FIG. 12 Experimental group 4 |
| --- | --- | --- | --- | --- | --- |
| Peripheral slope of the initial crystal growth interface | largest | Medium | Small | Small | large |
| Elapse time (hour) | 26.5 | 24 | 24 | 24 | 24 |
| Temperature gradient ° C./cm | 8.73 | 11.82 | 11.76 | 12.13 | 10.13 |

Computer simulations of the temperature gradient and the crystal growth interface are illustrated in FIGS. 8 to 12. The experiments were conducted on the growth of polysilicon crystal. The experimental results show that, when the heater setting 2 is in the first position, and when the top end of the heat insulation member 22 is substantially flush with an interface between the heat conductive base plate 51 and the bottom of the crucible 3, a better control of the temperature gradient is achieved, the peripheral edge of the initial crystal growth interface tends to be flat, and the resulting crystals have a lowered thermal stress. The experimental results also show that the experimental groups have the temperature gradients higher than that of the control group. Therefore, the elapse time for the crystal growth is shorter, the rate of the crystal growth is faster, and more twin boundaries are obtained in the experimental groups, compared to the control group. Accordingly, the polysilicon crystals obtained in the experimental groups have an improved crystal quality. Of course, depending on the requirement of the crystal growth or the control of the temperature heating zone, the position and the height of the heat insulation member 22 may be adjusted for individual products and need not be necessarily flush with the interface of the bottom of the crucible 3 and the heat conductive base plate 51.

In accordance with the crystal growth device of the present invention, the heating member 21 and the heat insulation member 22 of the heater setting 2 cooperate to form the first temperature heating zone 201 and the second temperature heating zone 202 having a stable temperature difference there between. By virtue of the first and second temperature heating zones 201, 202, which provides an instantaneous temperature change in the heat field set up by the heater setting 2, during the crystal growth process, the temperature of the heat field can be varied with higher temperature gradient for the nucleation and growth of the seeds in a single direction. Accordingly, a large amount of twin boundaries can be produced at the initial stage of crystal growth, and finally, a polysilicon crystal having a lowered crystal thermal stress and better crystal quality is obtained.

Figure 6:
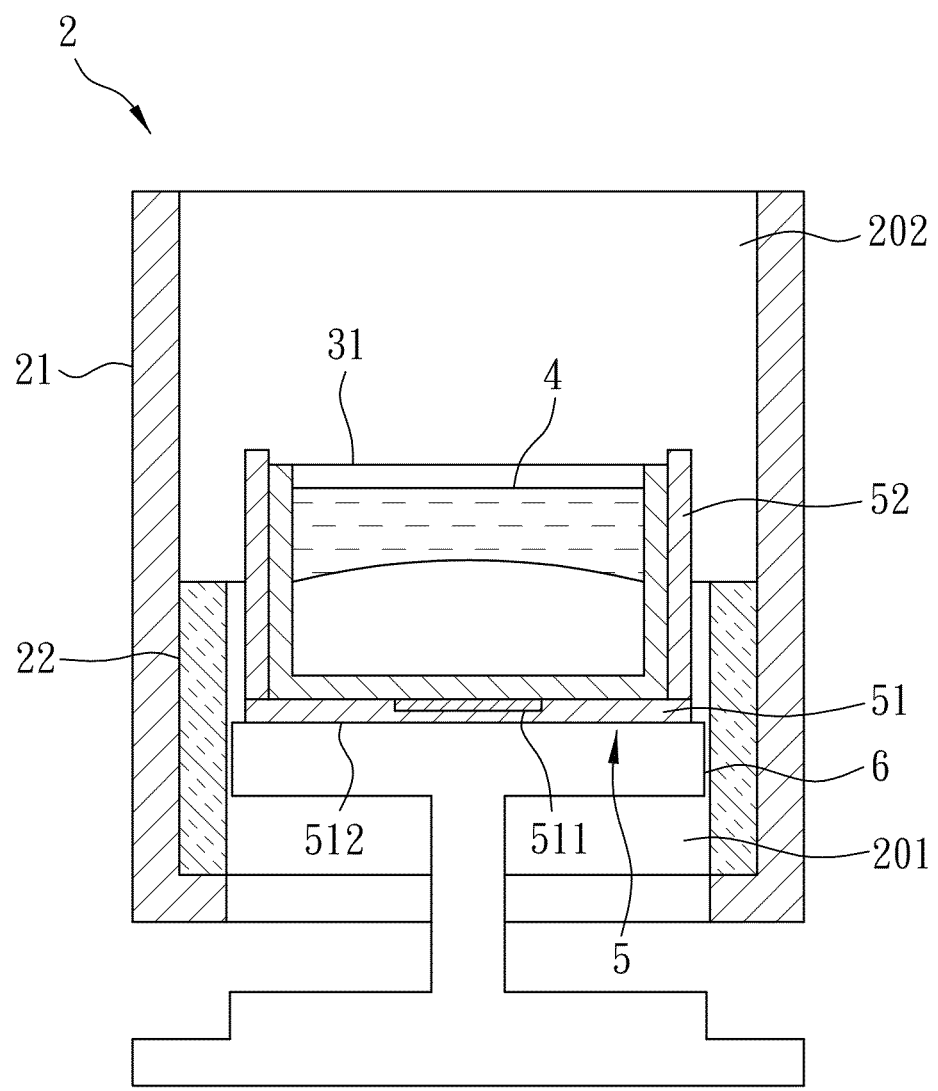
FIG. 6 is a sectional schematic view of a second preferred embodiment of a crystal growth device according to the present invention.

Referring to FIG. 6, a second preferred embodiment of a crystal growth device of the present invention is similar to the first preferred embodiment, except that the heat conductive base plate 51 of the heat conducting unit 5 includes a first heat exchange region 511 immediately below a middle part of the bottom of the crucible 3, and a second heat exchange region 512 surrounding the first heat exchange region 511 and having a heat conductivity lower than that of the first heat exchange region 511. In addition, the heat conductive surrounding wall 52 has a heat conductivity lower than that of the first heat exchange region 511 so that a cooling rate at the middle part of the bottom of the crucible 3 is higher than that at two sides of the crucible 3. An improved heat exchange effect can be obtained by virtue of the different heat absorbing effects occurring at different positions of the bottom of the crucible 3.

Figure 7:
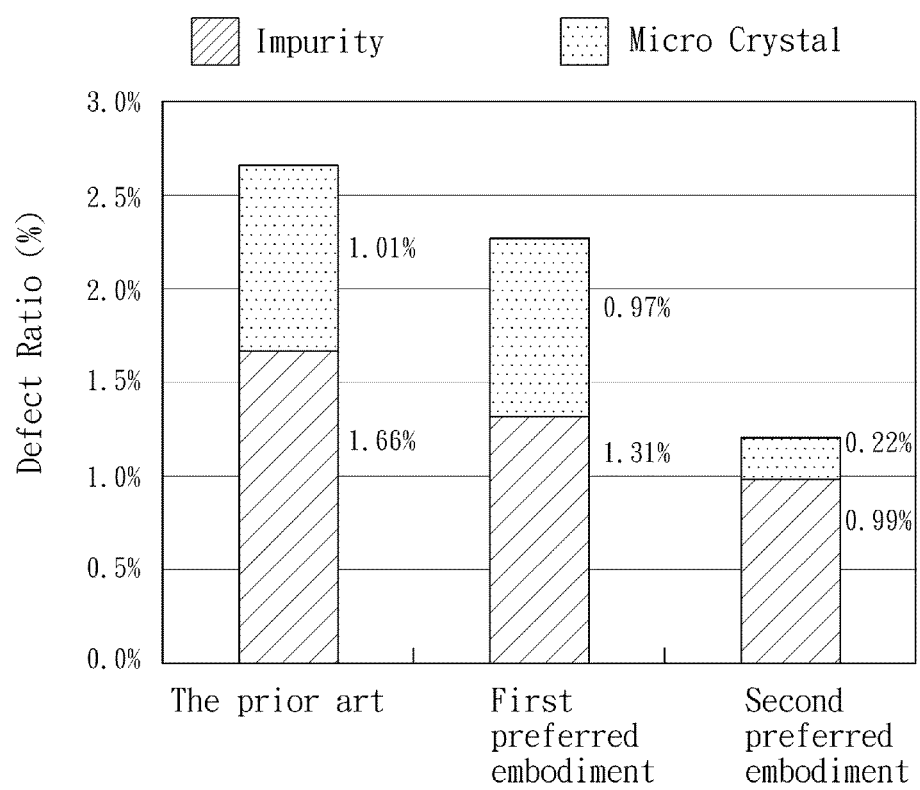
FIG. 7 is a bar chart illustrating the defect ratios resulting from crystal growth in the conventional crystal growth device and the crystal growth device of the present invention.

Referring to FIG. 7, the polysilicon crystal produced by the crystal growth device of the first embodiment of the present invention has an impurity content of about 1.31% and a micro-crystal in an amount of about 0.97%. When the polysilicon crystal is produced by the conventional crystal growth device (see FIG. 1), the impurity content is about 1.66% and the amount of the micro-crystal is about 1.01%. It is apparent that impurity ratio is reduced by the crystal growth device of the present invention due to the improvement of the crystal growth interface. It is noted that, by using the second preferred embodiment of the crystal growth device that has a specially designed heat conductive base plate 51 according to the present invention, the impurity content and the micro-crystal ratio can be reduced further to 0.99% and 0.22%. These results prove that, by virtue of the uniquely designed first and second temperature heating zones 201, 202 having a temperature difference there between and the uniquely designed heat conductive base plate 51 for the conduction of heat at the bottom of the crucible 3 to control the temperature variation of the crucible 3, crystals with an improved quality can be obtained.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A crystal growth device comprising:

a crucible having a bottom and a top opening; and a heater setting surrounding said crucible and movable relative to said crucible along a top-bottom direction of said crucible and between first and second positions, said heater setting including a first temperature heating zone and a second temperature heating zone higher in temperature than said first temperature heating zone, said heater setting being in said first position when said crucible is in said second temperature heating zone and in said second position when said crucible is in said first temperature heating zone, wherein said heater setting further includes a heating member surrounding said crucible to heat said crucible, and a heat insulation member completely disposed inside said heating member and around said crucible and covering an inner surface of a lower part of said heating member, said heating member being higher than said heat insulation member and having an upper part that is uncovered by said heat insulation member, said heat insulation member being unmovable relative to said lower part of said heating member, said heat insulation member is in direct contact with said inner surface of said lower part of said heating member, said upper part of said heating member surrounding said second temperature heating zone, said lower part of said heating member and said heat insulation member surrounding said first temperature heating zone.

2. The crystal growth device of claim 1, wherein said heat insulation member is made of a material having a heat conductivity of 0.5-0.01 W/mK.

3. The crystal growth device of claim 1, wherein, when said heater setting is in said first position, a top end of said heat insulation member is not higher than said bottom of said crucible.

4. The crystal growth device of claim 1, wherein said heater setting further includes a heat conducting unit, which has a heat conductive base plate below said bottom of said crucible, and a heat conductive surrounding wall extending upward from said heat conductive base plate around said crucible, said heat conductive base plate and surrounding wall having different heat conductivities.

5. The crystal growth device of claim 4, wherein said heat conductive base plate and surrounding wall are in contact with an outer surface of said crucible.

6. The crystal growth device of claim 4, wherein said heat conductive base plate is made of a material having a conductivity of not smaller than 100 W/mK.

7. The crystal growth device of claim 4, wherein said heat conductive base plate is made of a material having a heat conductivity of 100-250 W/mK.

8. The crystal growth device of claim 4, wherein said heat conductive base plate includes a first heat exchange region immediately below a middle part of said bottom of said crucible, and a second heat exchange region surrounding said first heat exchange region and having a heat conductivity lower than that of said first heat exchange region.

9. The crystal growth device of claim 8, wherein said heat conductive surrounding wall has a heat conductivity lower than that of said first heat exchange region.

10. The crystal growth device of claim 4, further comprising a heat conducting pedestal supporting said crucible and said heat conducting unit.

11. The crystal growth device of claim 10, wherein said heat conducting pedestal is disposed in contact with said heat conductive base plate to increase heat transfer between said heat conductive base plate and said crucible.

12. The crystal growth device of claim 1, wherein said heat insulation member has a height smaller than that of said crucible when said crucible is in said first temperature heating zone.

13. The crystal growth device of claim 1, wherein, when said crucible is in said first temperature heating zone, said top end of said heat insulation member is not lower than a top end of said crucible, and a bottom end of said heat insulation member is not higher than said bottom of said crucible.

* * * * *